(12) United States Patent
Jeong

(10) Patent No.: US 7,879,719 B2
(45) Date of Patent: Feb. 1, 2011

(54) INTERCONNECT STRUCTURE AND METHOD OF MANUFACTURING THE SAME

(75) Inventor: Eun-Soo Jeong, Eumsaong-gun (KR)

(73) Assignee: Dongbu HiTek Co., Ltd., Seoul (KR)

( * ) Notice: Subject to any disclaimer, the term of this patent is extended or adjusted under 35 U.S.C. 154(b) by 216 days.

(21) Appl. No.: 12/334,505

(22) Filed: Dec. 14, 2008

(65) Prior Publication Data

US 2009/0160064 A1    Jun. 25, 2009

(30) Foreign Application Priority Data

Dec. 24, 2007    (KR) ..................... 10-2007-0136244

(51) Int. Cl.
*H01L 21/44*    (2006.01)

(52) U.S. Cl. ...................... 438/638; 257/774

(58) Field of Classification Search ................. 438/638
See application file for complete search history.

(56) References Cited

U.S. PATENT DOCUMENTS 7,759,243 B2 *    7/2010    Ding et al. .................. 438/622

FOREIGN PATENT DOCUMENTS

KR    10-2002-0054633    7/2002

* cited by examiner

*Primary Examiner*—Thao X Le
*Assistant Examiner*—Kimberly Trice
(74) *Attorney, Agent, or Firm*—Sherr & Vaughn, PLLC

(57) ABSTRACT

A semiconductor device and a method for manufacturing the device that minimizes a line width while maximizing integration density of the semiconductor device. The method includes forming an interlayer insulating film on a semiconductor substrate, and then forming a first via hole in the interlayer insulating film, and then forming a resin material in the first via hole, and then forming a plurality of second via holes in the interlayer insulating film laterally, and then forming a resin material in the second via holes, and then simultaneously forming a plurality of third via holes in the interlayer insulating film and a trench spatially above and corresponding to the first via hole, and then removing the resin formed in the first via hole and the second via holes, and then simultaneously forming metal layers in the first via hole and the second and third via holes and the trench.

17 Claims, 5 Drawing Sheets

INTERCONNECT STRUCTURE AND METHOD OF MANUFACTURING THE SAME

Figure 1A:
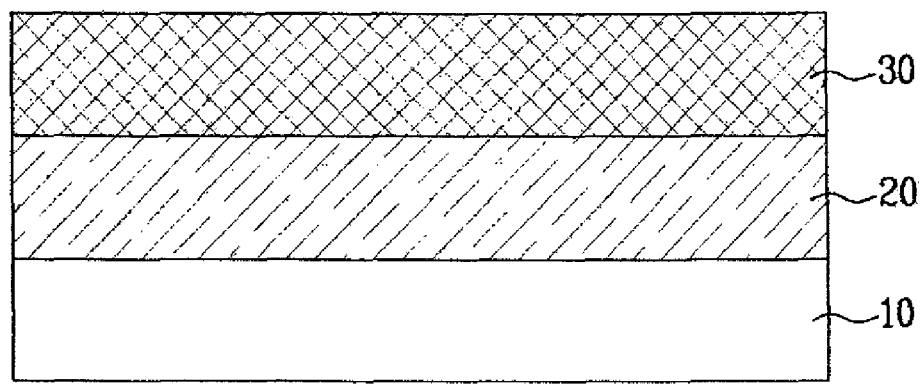

The present application claims priority under 35 U.S.C. §119 to Korean Patent Application No. 10-2007-0136244 (filed on Dec. 24, 2007), which is hereby incorporated by reference in its entirety.

BACKGROUND

In semiconductor manufacturing, double patterning (DP) is a process for forming aluminum lines which is difficult for application in a dual damascene process. In one method of forming a double pattern, a first photolithography process is performed using a hard mask. A first etching process is then performed on the hard mask and then the hard mask is patterned by a second photolithography process. An underlying metal layer formed under the hard mask is then etched to form metal lines. Another double patterning method involves etching the underlying metal layer using a photoresist instead of a hard mask. After stripping the photoresist, a second photolithography process for etching the metal layer is performed to form final metal lines. In still another double patterning method, first and second exposure processes are performed before performing a developing process to thereby form final metal lines. As previously noted, such double patterning methods are disadvantageous since they are difficult to apply in a dual damascene process.

SUMMARY

Embodiments relate to a semiconductor device and a method for manufacturing metal lines in a semiconductor device using a double patterning process which is applicable to form a dual damascene structure.

Embodiments relate to a method for manufacturing a semiconductor device that may include at least one of the following steps: forming an interlayer insulating film on and/or over a semiconductor substrate; and then forming a first via hole in the interlayer insulating film by a photolithography process; and then forming a resin in the first via hole; and then forming a plurality of second via holes adjacent to the first via hole by a photolithography process; and then forming a resin in the second via holes; and then simultaneously forming a plurality of third via holes between the second via holes by a photolithography process and a trench on and/or over and corresponding to the first via hole; and then removing the resin formed in the first via hole and the second via holes; and then forming metal layers in the first, second and third via holes and the trench.

Embodiments relate to a semiconductor device that may include at least one of the following: an interlayer insulating film formed on a semiconductor substrate; a first via formed in the interlayer insulating film exposing a portion of the semiconductor substrate; a trench via formed in the interlayer insulating film over and corresponding spatially to the first via; and a plurality of second vias formed in the interlayer insulating film adjacent to the trench via.

Embodiments relate to a method for manufacturing a semiconductor device that may include at least one of the following steps: forming an interlayer insulating film on a semiconductor substrate; and then forming a first via hole in the interlayer insulating film by a first photolithography process; and then forming a resin material in the first via hole; and then forming a plurality of second via holes in the interlayer insulating film laterally adjacent to the first via hole by a second photolithography process; and then forming a resin material in the second via holes; and then simultaneously forming a plurality of third via holes in the interlayer insulating film by a third photolithography process and a trench spatially above and corresponding to the first via hole; and then removing the resin formed in the first via hole and the second via holes; and then simultaneously forming metal layers in the first via hole and the second and third via holes and the trench.

Embodiments relate to a method that may include at least one of the following steps: sequentially forming a first interlayer insulating film and a second interlayer insulating film over a semiconductor substrate; and then forming a first via hole extending through the first interlayer insulating film and the second interlayer insulating film to expose a portion of the semiconductor substrate; and then filling the first via hole with a first resin material; and then simultaneously forming a second via hole and a third via hole extending through the second interlayer insulating film and partially in the first interlayer insulating film to expose portions of the first interlayer insulating film; and then simultaneously filling the second via hole with a second resin material and the third via hole with a third resin material; and then simultaneously forming a fourth via hole, a fifth via hole and a trench extending through the second interlayer insulating film and partially in the first interlayer insulating film, wherein the trench is formed over and corresponds spatially to the first via hole; and then removing the first, second and third resin materials to expose the first, second and third via holes, respectively; and then simultaneously forming first, second, third fourth and fifth vias and a contact in the first, second, third, fourth and fifth via holes and the trench, respectively.

DRAWINGS

Example FIGS. 1A to 1J illustrate sequential steps in a method for manufacturing a semiconductor device in accordance with embodiments.

DESCRIPTION

As illustrated in example FIG. 1A, first interlayer insulating film 20 and second interlayer insulating film 30 are sequentially formed on and/or over semiconductor substrate 10. Alternatively, reference numeral 10 may designate a lower metal layer instead of a semiconductor substrate. In accordance with embodiments, although two interlayer insulating films 20 and 30 are formed as illustrated in example FIG. 1A, a single interlayer insulating film may alternatively be formed or three or more interlayer insulating films may be formed. For example, in accordance with embodiments, the interlayer insulating films may include fluorosilicate glass (FSG) film 20 formed on and/or over semiconductor substrate 10 and a nitride or oxide film 30 formed on and/or over FSG film 20. Oxide film 30 may be formed using silane ($SiH_4$) gas. If second interlayer insulating layer 30 is composed of a nitride film, such film may be composed of silicon nitride (SiN).

Figure 1B:
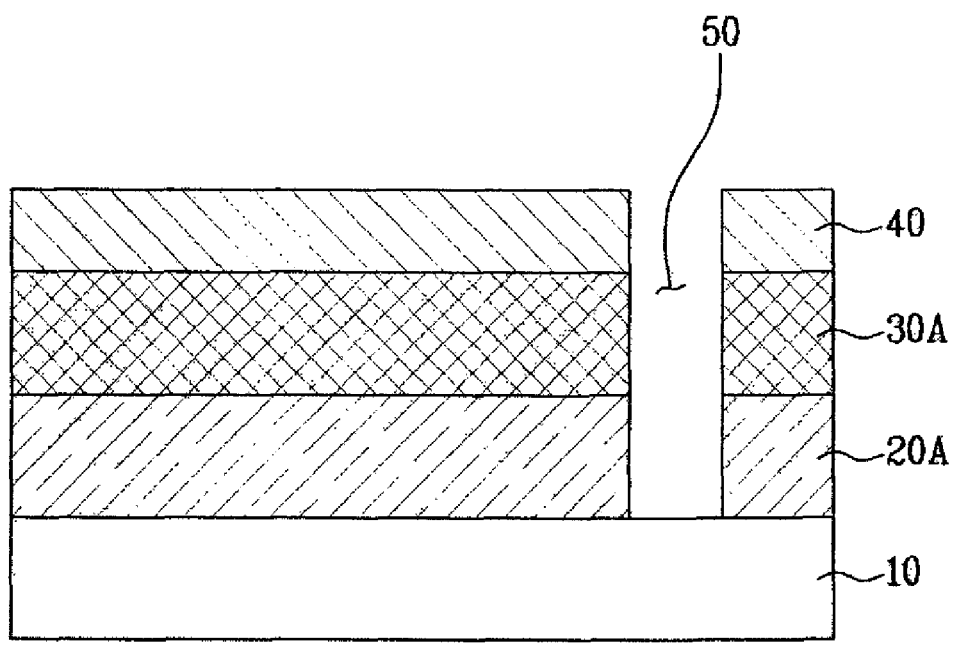

As illustrated in example FIG. 1B, first via hole 50 is formed in and extending through first interlayer insulating film 20 and second interlayer insulating film 30 exposing a portion of substrate 10 (or underlying metal layer) by a photolithography process. For example, first photoresist film pattern 40 is formed on and/or over second interlayer insulating film 30A to expose an area in which first via hole 50 is to be formed. First interlayer insulating film 20A and second interlayer insulating film 30A are then etched by reactive ion etching (RIE) using first photoresist film pattern 40 as a mask, thereby forming first via hole 50. After forming first via hole 50, photoresist film pattern 40 is removed by ashing.

Figure 1C:
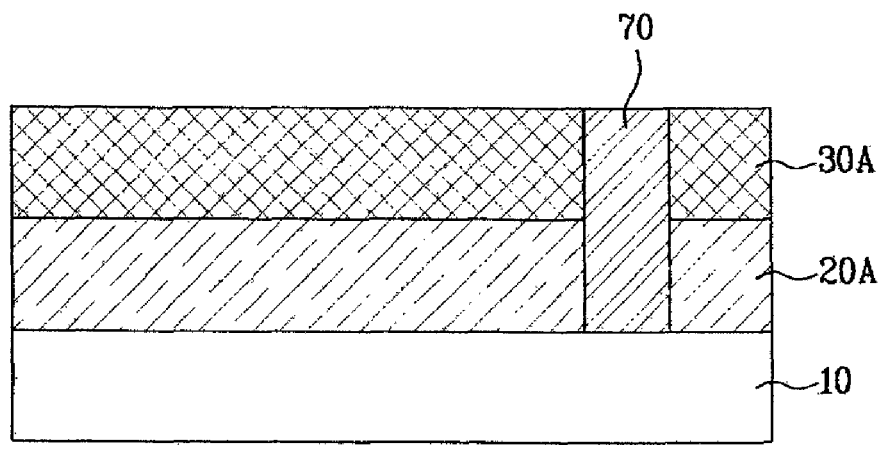
Figure 1D:
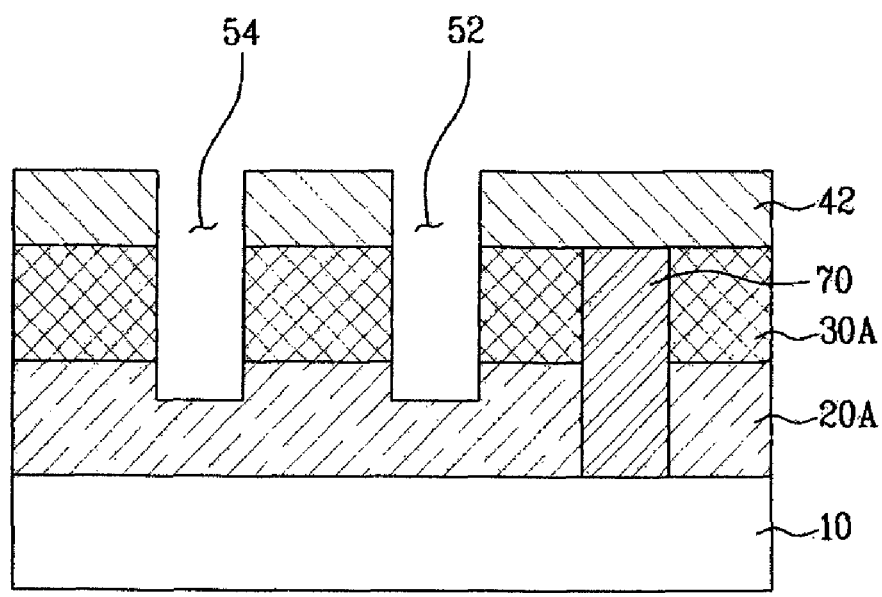
Figure 1E:
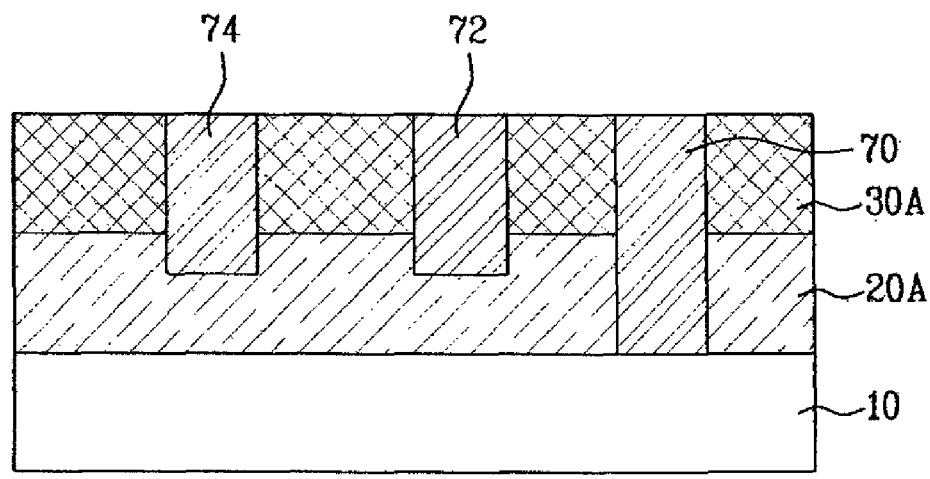

As illustrated in example FIG. 1C, resin material 70 is then formed in first via hole 50. In this case, the resin 70 may be a novolac resin. As illustrated in example FIG. 1D, a plurality of second via holes 52, 54 are then formed laterally adjacent to resin 70 formed in first via hole 50 by a photolithography process. For example, second photoresist film pattern 42 is formed on and/or over second interlayer insulating film 30A and resin material 70 to expose areas in which second via holes 52, 54 are to be formed. First interlayer insulating film 20A and second interlayer insulating film 30A are then etched by a second reactive ion etching (RIE) using second photoresist film pattern 42 as a mask to thereby form second via holes 52, 54. After forming second via holes 52, 54, photoresist film pattern 42 is removed. As illustrated in example FIG. 1E, second resin material 72 and third resin material 74 are then formed in second via holes 52, 54, respectively First resin 70, second resin 72 and third resin 74 may each be formed as novolac resins.

Figure 1F:
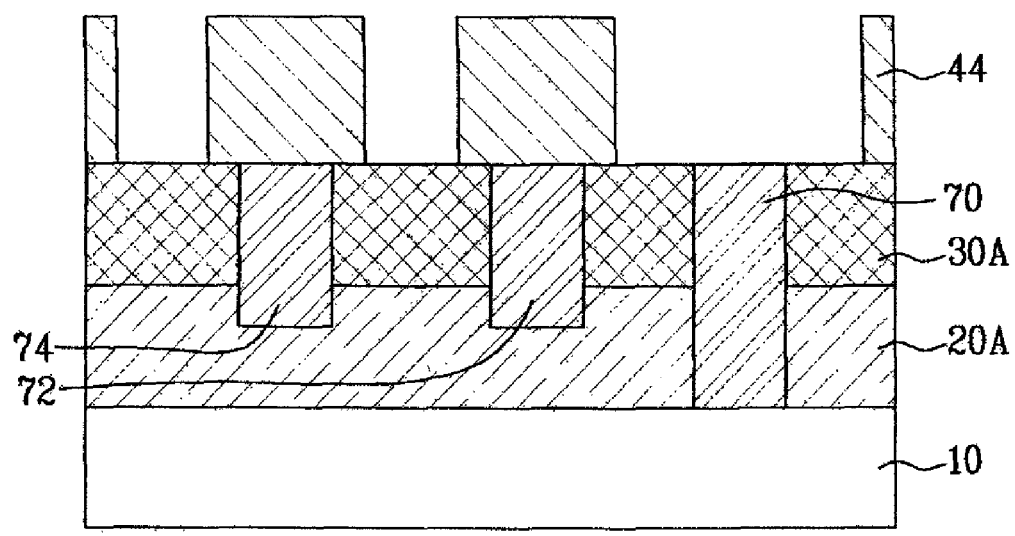
Figure 1G:
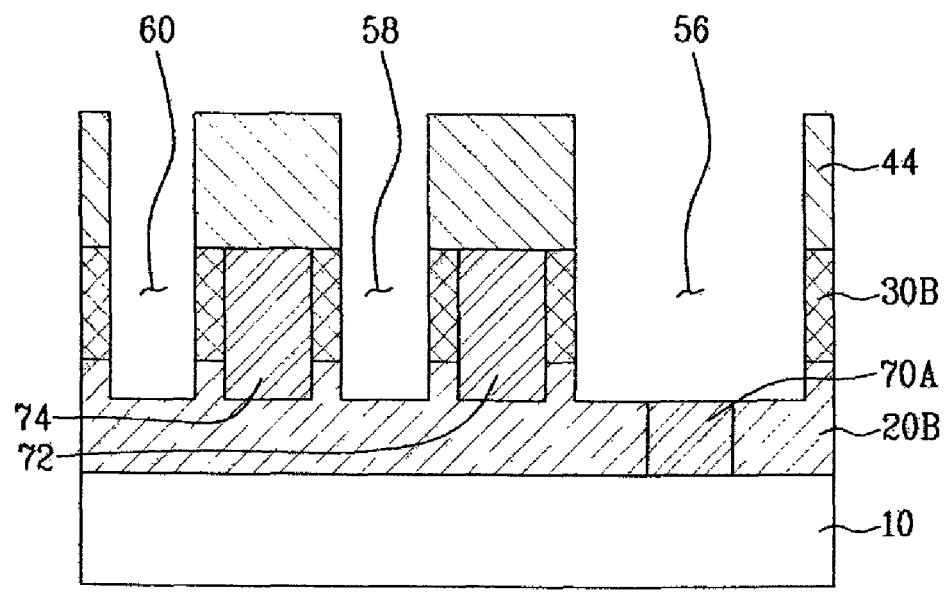
Figure 1H:
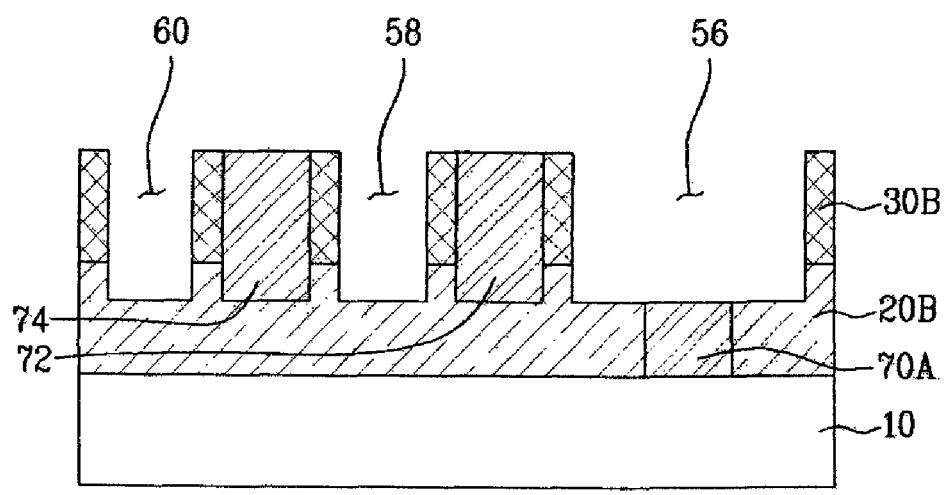

As illustrated in example FIGS. 1F to 1H, a plurality of third via holes 58, 60 are then formed on and/or over exposed areas of second interlayer insulating film 30A not filled with second resin 72 and third resin 74 in second via holes 52, 54 by a photolithography process. Simultaneously, trench 56 is formed on and/or over and corresponding spatially to first via hole 50. For example, as illustrated in example FIG. 1F, third photoresist film pattern 44 is formed on and/or over second interlayer insulating film 30A to expose areas in which third via holes 58, 60 and trench 56 are to be formed.

As illustrated in example FIG. 1G, while third photoresist film pattern 44 is used as an etching mask, first resin 70, first interlayer insulating film 20A and second interlayer insulating film 30A are etched by RIE, thereby forming third via holes 58, 60 and trench 56. While trench 56 is formed, a portion of resin 70A is etched and removed such that its uppermost surface is on a plane which is spatially below the plane of the uppermost surface of second resin 72 and third resin 74.

As illustrated in example FIG. 1H, after forming third via holes 58, 60 and trench 56, third photoresist film pattern 44 is removed by ashing.

Figure 1I:
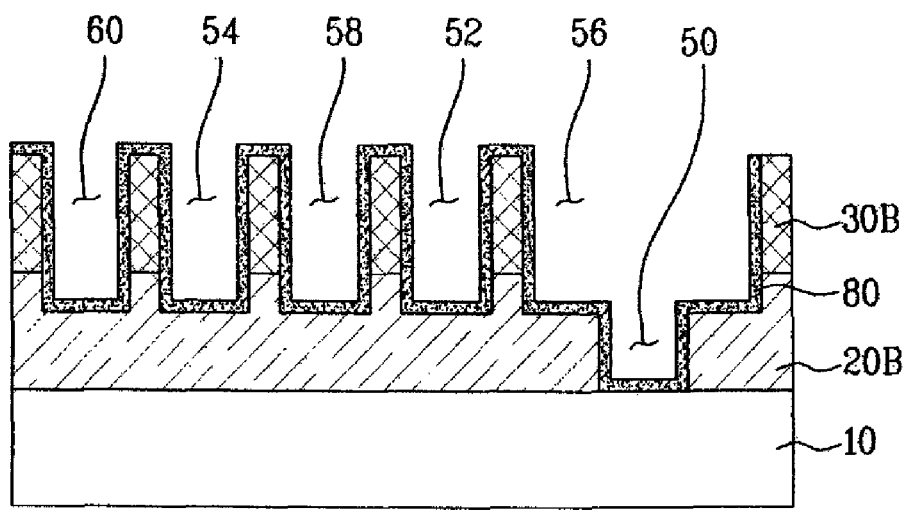

As illustrated in example FIG. 1I, resins 70A, 72 and 74 formed in first via hole 50 and second via holes 52, 54 are removed. In a case where resins 70A, 72 and 74 are novolac resins, the resins may be removed by a plasma process. After removing resins 70A, 72 and 74, at least one of an anti-diffusion film and metal barrier layer 80 is formed on and/or over the entire substrate 10 including inner walls of first via hole 50, trench 56, second via holes 52, 54 and third via holes 58, 60 in order to prevent diffusion of metal layers into interlayer insulating films 20B, 30B. The anti-diffusion film or metal barrier layer 80 may be deposited by at least one of a physical vapor deposition (PVD) method, a chemical vapor deposition (CVD) method or an atomic layer deposition (ALD) method. Anti-diffusion film 80 may be formed by depositing a material such as TaN, Ta, TaN/Ta, TiSiN, WN, TiZrN, TiN or Ti/TiN.

Figure 1J:
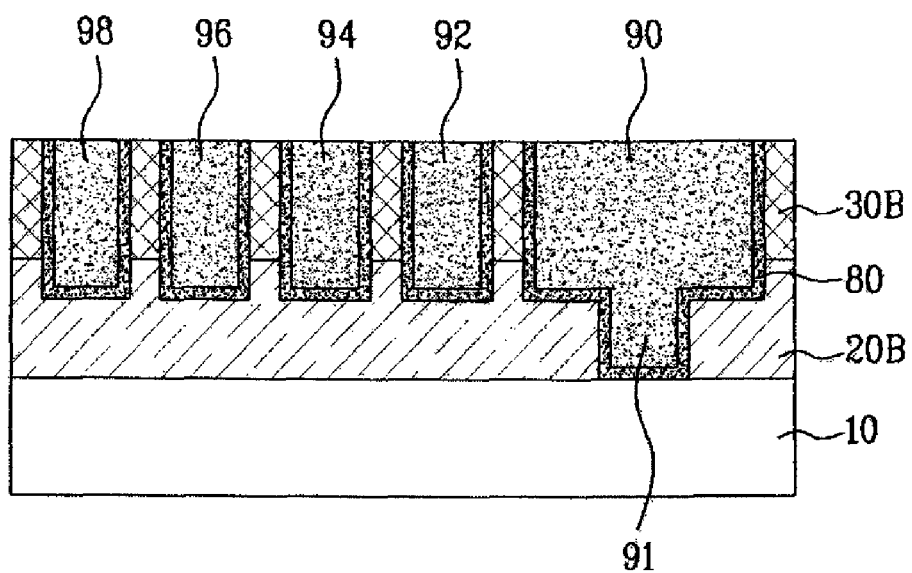

As illustrated in example FIG. 1J, first metal layer 90, second metal layer 92, third metal layer 94, fourth metal layer 96 and fifth metal layer 98 are then formed in via holes 50, 52, 54, 58 and 60 and trench 56. Each metal layer may be formed of copper, but is not limited thereto. First metal layer 90, second metal layer 92, third metal layer 94, fourth metal layer 96 and fifth metal layer 98 may be formed by at least one of a PVD method, a CVD method and an electroplating method. If first metal layer 90, second metal layer 92, third metal layer 94, fourth metal layer 96 and fifth metal layer 98 are formed by a electroplating method, a seed copper film is deposited on and/or over the entire surface of anti-diffusion film 80 by one of a PVD method and a CVD method. Then, the resultant is immersed in an electrolyte solution to form a thick copper metal layer. The thick copper metal layer is then planarized by a chemical mechanical polishing (CMP) process to expose an upper portion of second interlayer insulating film 30B, thereby forming first metal layer 90, second metal layer 92, third metal layer 94, fourth metal layer 96 and fifth metal layer 98.

Accordingly, a semiconductor device in accordance with embodiments is formed that includes interlayer insulating films 20B, 30B formed on and/or over semiconductor substrate 10. Interlayer insulating films 20B and 30B may alternatively be formed on and/or over a lower metal layer formed on and/or over semiconductor substrate 10. Meaning, the semiconductor device in accordance with embodiments may have a stacked structure obtained by repeatedly forming the structure shown in example FIG. 1J in a vertical direction. In this case, first metal layer 90, second metal layer 92, third metal layer 94, fourth metal layer 96 and fifth metal layer 98 become upper metal layers.

Interlayer insulating films 20B, 30B may have a multilayer structure including FSG film 20B formed on and/or over semiconductor substrate 10 and oxide film 30B formed on and/or over FSG film 20B. First via 91 is formed in first interlayer insulating film 20B on and/or over semiconductor substrate 10 and corresponds to the metal layer filled in first via hole 50. Trench via 90 is formed in interlayer insulating films 20B and 30B spatially above first via 91 and corresponds to the metal layer filled in trench 56. Second via 92, third via 94, fourth via 96 and fifth via 98 are formed adjacent to trench via 90. Second via 92 and fourth via 96 correspond to the metal layers filled in second via holes 52, 54 while third via 94 and fifth via 98 correspond to the metal layers filled in third via holes 58, 60.

In the semiconductor device and the method of manufacturing the device in accordance with embodiments, the metal layers are formed to be applicable to a dual damascene process by double patterning. Accordingly, it is possible to minimize a line width in the photolithography and there is an effect of maximizing integration density of the semiconductor device.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for manufacturing a semiconductor device comprising:
    forming an interlayer insulating film on a semiconductor substrate; and then
    forming a first via hole in the interlayer insulating film by a first photolithography process; and then
    forming a resin material in the first via hole; and then
    forming a plurality of second via holes in the interlayer insulating film laterally adjacent to the first via hole by a second photolithography process; and then
    forming a resin material in the second via holes; and then simultaneously forming a plurality of third via holes in the interlayer insulating film by a third photolithography process and a trench spatially above and corresponding to the first via hole; and then removing the resin formed in the first via hole and the second via holes; and then simultaneously forming metal layers in the first via hole and the second and third via holes and the trench.

2. The method of claim 1, wherein the resins comprise a novolac resin.

3. The method of claim 1, wherein the interlayer insulating film has a multilayer structure.

4. The method of claim 1, wherein forming the interlayer insulating film comprises:

forming a fluorosilicate glass (FSG) film on the semiconductor substrate; and then forming an oxide film on the FSG film.

5. A method comprising:

sequentially forming a first interlayer insulating film and a second interlayer insulating film over a semiconductor substrate; and then forming a first via hole extending through the first interlayer insulating film and the second interlayer insulating film to expose a portion of the semiconductor substrate; and then filling the first via hole with a first resin material; and then simultaneously forming a second via hole and a third via hole extending through the second interlayer insulating film and partially in the first interlayer insulating film to expose portions of the first interlayer insulating film; and then simultaneously filling the second via hole with a second resin material and the third via hole with a third resin material; and then simultaneously forming a fourth via hole, a fifth via hole and a trench extending through the second interlayer insulating film and partially in the first interlayer insulating film, wherein the trench is formed over and corresponds spatially to the first via hole; and then removing the first, second and third resin materials to expose the first, second and third via holes, respectively; and then simultaneously forming first, second, third fourth and fifth vias and a contact in the first, second, third, fourth and fifth via holes and the trench, respectively.

6. The method of claim 5, wherein sequentially forming the first interlayer insulating film and the second interlayer insulating film comprises:

forming a first dielectric film on the semiconductor substrate; and then forming a second dielectric film on the first dielectric film.

7. The method of claim 6, wherein the first dielectric film comprises fluorosilicate glass (FSG).

8. The method of claim 6, wherein the second dielectric film comprises silicon nitride (SiN).

9. The method of claim 6, wherein the second dielectric film comprises an oxide.

10. The method of claim 5, wherein forming the first via hole comprises:

forming a first photoresist film on the second interlayer insulating film and then forming a first photoresist film pattern; and then performing a first etching process on the first interlayer insulating film and the second interlayer insulating film using the first photoresist film pattern as a mask to thereby form the first via hole; and then removing the first photoresist film pattern.

11. The method of claim 10, wherein the metal layer comprises copper.

12. The method of claim 5, wherein simultaneously forming the second via hole and the third via hole comprises:

forming a second photoresist film on the second interlayer insulating film and then forming a second photoresist film pattern; and then performing a second etching process on the first interlayer insulating film and the second interlayer insulating film using the second photoresist film pattern as a mask to thereby form the second via hole and the third via hole; and then removing the second photoresist film pattern.

13. The method of claim 5, wherein simultaneously forming the fourth via hole, the fifth via hole and the trench comprises:

forming a third photoresist film on the second interlayer insulating film and then forming a third photoresist film pattern; and then performing a third etching process on the first interlayer insulating film, the second interlayer insulating film and the first resin material using the third photoresist film pattern to thereby form the fourth via hole, the fifth via hole and the trench; and then removing the third photoresist film pattern.

14. The method of claim 5, wherein simultaneously forming first, second, third fourth and fifth vias and the contact comprises:

forming a barrier layer on sidewalls of the first, second, third, fourth and fifth via holes and the trench; and then forming a metal layer on the barrier layer.

15. The method of claim 14, wherein the barrier layer comprises a barrier metal layer.

16. The method of claim 15, wherein the barrier metal layer comprises at least one of titanium, tungsten and tantalum.

17. The method of claim 15, wherein the barrier metal layer comprises at least one of TaN, Ta, TaN/Ta, TiSiN, WN, TiZrN, TiN and Ti/TiN.

* * * * *